United States Patent
Don et al.

(10) Patent No.: US 12,095,515 B2
(45) Date of Patent: *Sep. 17, 2024

(54) ANTENNA RADIATION PATTERN COMPRESSIVE SENSING

(71) Applicant: CCDC Army Research Laboratory, Adelphi, MD (US)

(72) Inventors: Michael L. Don, Baltimore, MD (US); Gonzalo R. Arce, Newark, DE (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 180 days.

This patent is subject to a terminal disclaimer.

(21) Appl. No.: 17/592,603

(22) Filed: Feb. 4, 2022

(65) Prior Publication Data
US 2023/0254050 A1 Aug. 10, 2023

(51) Int. Cl.
| | |
|---|---|
| *H04B 17/00* | (2015.01) |
| *G01R 29/08* | (2006.01) |
| *H04B 17/10* | (2015.01) |
| *H04B 17/12* | (2015.01) |
| *H04B 17/391* | (2015.01) |
| *G06F 17/14* | (2006.01) |
| *H04B 17/17* | (2015.01) |

(52) U.S. Cl.
CPC ..... *H04B 17/0085* (2013.01); *G01R 29/0814* (2013.01); *H04B 17/102* (2015.01); *H04B 17/12* (2015.01); *H04B 17/391* (2015.01)

(58) Field of Classification Search
CPC ...... H04B 17/102; H04B 17/12; H04B 17/17; H04B 7/0452; H04B 7/0456; G01R 29/10; G01R 23/17; G06T 11/005; G06T 11/006; G06T 2207/10101; G06T 2211/424; G06T 7/0002; G06T 9/00
See application file for complete search history.

(56) References Cited

U.S. PATENT DOCUMENTS

| | | | | |
|---|---|---|---|---|
| 10,536,226 | B1* | 1/2020 | Huynh | H04B 17/16 |
| 11,444,700 | B2* | 9/2022 | Don | G01R 29/10 |
| 2013/0315081 | A1* | 11/2013 | Kim | H04B 7/0486 |
| | | | | 370/252 |
| 2016/0028447 | A1* | 1/2016 | Etkin | H04B 7/024 |
| | | | | 455/561 |

(Continued)

OTHER PUBLICATIONS

Fienup, James R. "Phase retrieval algorithms: a comparison." Applied optics 21.15 (1982): 2758-2769.

(Continued)

*Primary Examiner* — Alvaro E Fortich
(74) *Attorney, Agent, or Firm* — Christos S. Kyriakou

(57) ABSTRACT

A method and apparatus for measuring antenna radiation patterns comprising an array of test antennas coupled to at least one transmitter and an antenna under test located proximate to the array of test antennas. A compressive sensing processor is coupled to the antenna under test and the array of test antennas to control signals emitted and received by the antenna under test and the array of test antennas. The received signals comprise either amplitude only signals or amplitude and phase signals. The compressive sensing processor processes the received signals using compressive sensing to produce an antenna radiation pattern.

18 Claims, 15 Drawing Sheets

(56) References Cited

U.S. PATENT DOCUMENTS

| | | | |
|---|---|---|---|
| 2018/0080967 A1* | 3/2018 | Lee | G01R 29/10 |
| 2018/0159638 A1* | 6/2018 | Awadin | H01Q 21/08 |

OTHER PUBLICATIONS

J.-C. Bolomey, B. J. Cown, G. Fine, L. Jofre, M. Mostafavi, D. Picard, J. Estrada, P. Friederich, and F. Cain, "Rapid near-field antenna testing via arrays of modulated scattering probes," IEEE Transactions on Antennas and Propagation, vol. 36, No. 6, pp. 804-814, 1988.

O. M. Bucci, G. D'elia, G. Leone, and R. Pierri, "Far-field pattern determination from the near-field amplitude on two surfaces," IEEE transactions on antennas and propagation, vol. 38, No. 11, pp. 1772-1779, 1990.

Lehto, J. Tuovinen, O. Boric, and A. Raisanen, "Accurate millimeter wave antenna phase pattern measurements using the differential phase method with three power meters," IEEE transactions on antennas and propagation, vol. 40, No. 7, pp. 851-853, 1992.

R. G. Yaccarino and Y. Rahmat-Samii, "Phaseless bi-polar planar nearfield measurements and diagnostics of array antennas," IEEE Transactions on Antennas and Propagation, vol. 47, No. 3, pp. 574-583, 1999.

G. Junkin, T. Huang, and J. C. Bennett, "Holographic testing of terahertz antennas," IEEE Transactions on Antennas and Propagation, vol. 48, No. 3, pp. 409-417, 2000.

P. Iversen, P. Garreau, and D. Burrell, "Real-time spherical nearfield handset antenna measurements," IEEE Antennas and Propagation Magazine, vol. 43, No. 3, pp. 90-94, 2001.

S. Costanzo and G. Di Massa, "An integrated probe for phaseless near field measurements," Measurement, vol. 31, No. 2, pp. 123-129, 2002.

D. Smith, M. Leach, and A. Sambell, "An indirect holographic method for determining antenna radiation patterns and imaging antenna fields," in IEEE Antennas and Propagation Society International Symposium (IEEE Cat. No. 02CH37313), vol. 3. IEEE, 2002, pp. 706-709.

T. Laitinen, J. Ollikainen, C. Icheln, and P. Vainikainen, "Rapid spherical 3-d field measurement system for mobile terminal antennas," in Proceedings of the 20th IEEE Instrumentation Technology Conference (Cat. No. 03CH37412), vol. 2. IEEE, 2003, pp. 968-972.

L. Duchesne, P. Garreau, N. Robic, A. Gandois, P. O. Iversen, and G. Barone, "Compact multi-probe antenna test station for rapid testing of antennas and wireless terminals," Technical Seminar on Antenna Measurements and SAR, 2004.

D. L. Donoho, "Compressed sensing," IEEE Transactions on information theory, vol. 52, No. 4, pp. 1289-1306, 2006.

E. J. Cand'es, J. Romberg, and T. Tao, "Robust uncertainty principles: Exact signal reconstruction from highly incomplete frequency information," IEEE Transactions on information theory, vol. 52, No. 2, pp. 489-509, 2006.

M. Elad, "Optimized projections for compressed sensing," IEEE Transactions on Signal Processing, vol. 55, No. 12, pp. 5695-5702, 2007.

Moravec, Matthew L., Justin K. Romberg, and Richard G. Baraniuk. "Compressive phase retrieval." Wavelets XII. vol. 6701. International Society for Optics and Photonics, 2007.

S. F. Razavi and Y. Rahmat-Samii, "A new look at phaseless planar near-field measurements: limitations, simulations, measurements, and a hybrid solution," IEEE Antennas and Propagation Magazine, vol. 49, No. 2, pp. 170-178, 2007.

V. Schejbal, V. Kovarik, and D. Cermak, "Synthesized-reference-wave holography for determining antenna radiation characteristics," IEEE Antennas and Propagation Magazine, vol. 50, No. 5, pp. 71-83, 2008.

Y. Alvarez, F. Las-Heras, and M. R. Pino, "The sources reconstruction method for amplitude-only field measurements," IEEE transactions on Antennas and Propagation, vol. 58, No. 8, pp. 2776-2781, 2010.

H. Ohlsson, A. Y. Yang, R. Dong, and S. S. Sastry, "Compressive phase retrieval from squared output measurements via semidefinite programming," IFAC Proceedings Volumes, vol. 45, No. 16, pp. 89-94, 2012.

P. Netrapalli, P. Jain, and S. Sanghavi, "Phase retrieval using alternating minimization," in Advances in Neural Information Processing Systems, 2013, pp. 2796-2804.

G. Schnattinger, C. Lopez, E. Kilic, and T. F. Eibert, "Fast near-field far-field transformation for phaseless and irregular antenna measurement data," Advances in Radio Science, vol. 12, pp. 171-177, 2014.

P. Schniter and S. Rangan, "Compressive phase retrieval via generalized approximate message passing," IEEE Transactions on Signal Processing, vol. 63, No. 4, pp. 1043-1055, 2014.

Y. Shechtman, A. Beck, and Y. C. Eldar, "Gespar: Efficient phase retrieval of sparse signals," IEEE transactions on signal processing, vol. 62, No. 4, pp. 928-938, 2014.

L. Foged, G. Barone, and F. Saccardi, "Antenna measurement systemsusing multi-probe technology," in 2015 IEEE Conference on Antenna Measurements & Applications (CAMA). IEEE, 2015, pp. 1-3.

D. Loschenbrand and C. Mecklenbrauker, "Fast antenna characterization via a sparse spherical multipole expansion," in 2016 4th International Workshop on Compressed Sensing Theory and its Applications to Radar, Sonar and Remote Sensing (CoSeRa). IEEE, 2016, pp. 212-216.

R. Cornelius, D. Heberling, N. Koep, A. Behboodi, and R. Mathar, "Compressed sensing applied to spherical near-field to far-field transformation," in 2016 10th European Conference on Antennas and Propagation (EuCAP). IEEE, 2016, pp. 1-4.

A. Paulus, J. Knapp, and T. F. Eibert, "Phaseless near-field far-field transformation utilizing combinations of probe signals," IEEE Transactions on Antennas and Propagation, vol. 65, No. 10, pp. 5492-5502, 2017.

B. Fuchs, L. Le Coq, S. Rondineau, and M. D. Migliore, "Fast antenna far-field characterization via sparse spherical harmonic expansion," IEEE Transactions on Antennas and Propagation, vol. 65, No. 10, pp. 5503-5510, 2017.

P. Debroux and B. Verdin, "Compressive sensing reconstruction of wideband antenna radiation characteristics," Progress In Electromagnetics Research, vol. 73, pp. 1-8, 2017.

M. L. Don and G. R. Arce, "Antenna Radiation Pattern Compressive Sensing," MILCOM 2018—2018 IEEE Military Communications Conference (MILCOM), 2018, pp. 174-181, doi: 10.1109/MILCOM.2018.8599791.

C. Culotta-L'opez, D. Heberling, A. Bangun, A. Behboodi, and R. Mathar, "A compressed sampling for spherical near-field measurements," in 2018 AMTA Proceedings. IEEE, 2018, pp. 1-6.

B. Hofmann, O. Neitz, and T. F. Eibert, "On the minimum number of samples for sparse recovery in spherical antenna near-field measurements," IEEE Transactions on Antennas and Propagation, vol. 67, No. 12, pp. 7597-7610, 2019.

Bangun, C. Culotta-L'opez, A. Behboodi, R. Mathar, and D. Heberling, "On phaseless spherical near-field antenna measurements," in 2019 13th European Conference on Antennas and Propagation (EuCAP). IEEE, 2019, pp. 1-5.

\* cited by examiner

800

TABLE I
A COMPARISON OF TRADITIONAL MEASUREMENT METHODS

|  | TS | TC | TP |
|---|---|---|---|
| Transmitters | $n_\theta n_\varphi$ | $n_\theta$ | 1 |
| Samples | $n_\theta n_\varphi$ | $n_\theta n_\varphi$ | $n_\theta n_\varphi$ |
| Movements | 0 | $n_\varphi$ | $n_\theta n_\varphi$ |
| Total Time | $n_\theta n_\varphi t_s$ | $n_\varphi(n_\theta t_s + t_m)$ | $n_\theta n_\varphi(t_s + t_m)$ |

TABLE II
A COMPARISON OF CS MEASUREMENT METHODS

|  | IS | RS | IC | RC |
|---|---|---|---|---|
| Trans. | $n_\theta n_\varphi$ | $n_\theta n_\varphi r_n$ | $n_\theta$ | $n_\varphi r_n$ |
| Samp. | $n_\theta n_\varphi r_m$ | $n_\theta n_\varphi r_m$ | $n_\theta n_\varphi r_m$ | $n_\theta n_\varphi r_m$ |
| Mov. | 0 | $n_\theta$ | $n_\varphi$ | $n_\theta n_\varphi r_m$ |
| Time | $n_\theta n_\varphi r_m t_s$ | $n_\theta n_\varphi r_m t_s + n_\theta t_m$ | $n_\theta n_\varphi r_m t_s + n_\varphi t_m$ | $n_\theta n_\varphi r_m t_s + n_\theta n_\varphi r_m t_m$ |

TABLE III
A COMPARISON OF THE METHODS WITH EXAMPLE VALUES

|  | TS | TC | TP | IS | RS | IC | RC |
|---|---|---|---|---|---|---|---|
| Trans. | 2048 | 64 | 1 | 2048 | 32 | 64 | 32 |
| Samp. | 2048 | 2048 | 2048 | 512 | 640 | 256 | 128 |
| Mov. | 0 | 32 | 2048 | 0 | 64 | 32 | 128 |
| Time (s) | 205 | 301 | 6349 | 51 | 256 | 122 | 397 |

FIG. 25

ANTENNA RADIATION PATTERN COMPRESSIVE SENSING

GOVERNMENT INTEREST

The invention described herein may be manufactured, used and licensed by or for the U.S. Government.

CROSS-REFERENCE TO RELATED APPLICATIONS

This application claims benefit to U.S. Provisional Patent Application Ser. No. 63/139,184, filed 19 Jan. 2021, U.S. Provisional Patent Application Ser. No. 63/139,849, filed 21 Jan. 2021 and U.S. Provisional Patent Application Ser. No. 63/139,871, filed 21 Jan. 2021, each entitled "Antenna Radiation Pattern Comprehensive Phase Retrieval," and is a continuation-in-part of U.S. patent application Ser. No. 16/591,982, filed 3 Oct. 2019 and entitled "Antenna Radiation Pattern Comprehensive Sensing," which are all hereby incorporated herein by reference in their entireties.

BACKGROUND

Field

Embodiments of the present invention generally relate to antennas and, more particularly, to techniques for measuring antenna patterns.

Description of the Related Art

Modern wireless communications are placing ever greater demands on communication system antennas. Ultra-wide band communications and ranging, cognitive radio, and low probability of intercept applications require high antenna performance across a greater range of wavelengths than traditional, narrowband radio. Beamforming applications require complex antenna arrays. Many direction of arrival systems require a precise characterization of the antenna radiation pattern (ARP) for optimal performance. Unfortunately, ARP measurement is an expensive, time consuming process, especially when performed over a range of wavelengths.

A simple antenna pattern measurement system consists of a transmitter, an antenna under test (AUT), a two-stage rotation platform to adjust azimuth and elevation, and a device to compare the AUT's phase and amplitude to a reference signal. In a traditional sampling technique, the gain and phase are measured (sampled) as the AUT is rotated through every azimuth and elevation position for each wavelength of interest. The rotation and measurement process requires an excessive amount of time, e.g., eight to fifteen hours for a typical antenna.

Inpainting is an ARP measurement technique that is similar to traditional sampling. It is commonly used in image processing to fill in missing parts of an image. In the context of ARP measurement, the pattern can be purposely sub-sampled, recovering the missing samples through inpainting. Unlike traditional sampling, the samples are not required to be evenly spaced, allowing more flexibility in the sampling process. Although inpainting can produce high quality results for data with low frequency content, it can be inaccurate if the sub-samples miss small features in the data.

Meanwhile, over the last decade a new technique has emerged stimulating a great amount of research in the signal processing community. Compressive sensing (CS) has been touted as the sampling paradigm of the future, enabling higher performance in areas such as signal resolution, system power, and measurement speed. But CS is not well suited to every application. In order to exploit the full benefits of CS, four criteria should be met. First, the data must be sufficiently sparse. Although many signals are naturally sparse, higher-dimensional data is typically extremely sparse, significantly improving CS performance. Second, current standard measurement costs must be very high in order to make the additional costs of specialized CS hardware worthwhile. Third, precise knowledge of the measurement environment is required to recover the data from the compressed samples. A controlled laboratory setting would be an ideal environment. And fourth, there should be sufficient time and computing power available to run the computationally intensive data recovery algorithms. It is possible to use CS without meeting these requirements, but significant design challenges would have to be overcome for the system to be practically viable. ARP measurement also meets these requirements: 2D ARP data taken over multiple wavelengths can be very sparse, measurement facilities are expensive, measurements are generally taken in a controlled environment, and the compressive measurements can easily be post-processed with a powerful computer.

Therefore, there is a need in the art to utilize compressive sensing in generating antenna radiation patterns using amplitude measurements or amplitude and phase measurements.

SUMMARY OF THE INVENTION

Embodiments of the invention include a method and apparatus for generating antenna radiation patterns using compressive sensing (CS). The apparatus comprises at least a ring of probes (i.e., either transmitting antennas or receiving antennas arranged in a multi-probe architecture) circumscribing an antenna under test (AUT). The probes and the AUT are coupled to a CS processor. The CS processor controls the probes and gathers either amplitude or amplitude and phase signal samples from the AUT. The CS processor generates an ARP for the AUT through CS processing of the signal samples.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 25 presents Tables I, II and III.

DETAILED DESCRIPTION

In the detailed description that follows, the term frequency can refer to the oscillation of electromagnetic waves, or the coefficients of data in a frequency basis. To avoid confusion, the term "wavelength" is used when referring to electromagnetic waves, while "frequency" is used to refer to data. In addition, θ and φ are used as both angles and matrix indices; their use will be clear from the context.

Figure 1:
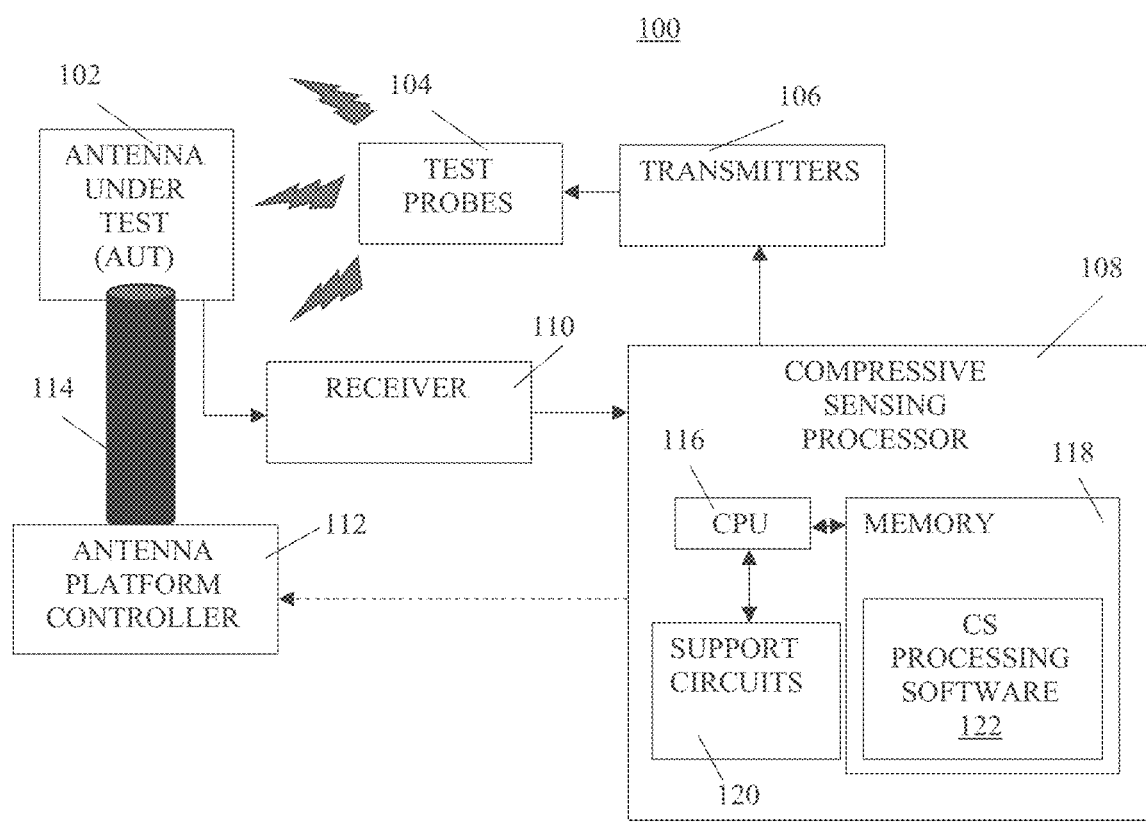
FIG. 1 is a block diagram of an embodiment of the invention comprising an antenna radiation pattern measurement system.

FIG. 1 is a block diagram of an embodiment of the invention comprising a antenna radiation pattern (ARP) measurement system 100. The ARP measurement system 100 comprises an antenna under test (AUT) 102 centrally located in an array of probes (e.g., test antennas) 104. The probes 104 are coupled to individual transmitters 106. The AUT 102 and the transmitters 106 are coupled to a compressive sensing (CS) processor 108 such that the CS processor 108 controls activation and operational parameters of the transmitters 106 as well as gathers received signals from the AUT 102 via a receiver 110. The CS processor 108 uses CS techniques to process the AUT signals to generate an ARP for the AUT 102.

In some embodiments, as described below, the AUT 102 does not need to be rotated. In other embodiments it does need to be rotated during testing. As such, an AUT mounting platform 114 and antenna platform controller 112 are shown. The controller 112 is controlled by the CS processor 108 to ensure the platform is positioned correctly for each measurement.

FIG. 1 further depicts a block diagram of one embodiment of the CS processor 108. The processor 108 comprises at least one central processing unit (CPU) 116 that is capable of performing the CS signal processing described below. Such a CPU 116 may include one or more microprocessors, gate arrays, microcontrollers, and the like. Functionality of the CPU 116 is supported by support circuits 120 that may include power supplies, clock circuits, input/output circuit(s), analog to digital converter(s), filters and other well-known support circuits. The support circuits may provide sampling, filtering or other pre-processing of the signals received by the test probes 104. A memory 118 (also referred to as a computer readable medium) stores CS processing software 122 that is executed by the CPU 116. The memory may comprise a combination of random access memory, read only memory, removable storage, hard drive storage, solid state storage, and the like. The software 122 specifically comprises CS processing software that, when executed by the CPU 116, performs the CS processing of the signals received by the test probes 104 as described below with reference to FIGS. 2-24.

Although, throughout this description, the AUT 102 is defined as being a receiving antenna and the test probes 104 are described as being transmitting antennas, those skilled in the art will understand that the reverse arrangement could be used—the AUT 102 may be a transmitting antenna and the test antennas 104 may be receiving antennas. The processes and results described below are the same whether the AUT is receiving signals or transmitting signals.

Unlike traditional sampling or inpainting, whose performance depends on the frequency content of the data, CS performance only depends on the data's sparsity. This makes CS a favorable choice for the many types of signals that exhibit natural sparsity, such as antenna patterns.

The sampling of data $x \in \mathbb{R}^{n \times 1}$ to produce measurements $y \in \mathbb{R}^{m \times 1}$ can be represented as $$y = Ax, \quad (1)$$

where $A \in \mathbb{R}^{m \times n}$ is the sensing matrix. In standard sampling, the number of measurements is the same as the size of the data, and A is a n×n identity matrix. In compressive sensing, the sensing matrix elements are selected from random, or pseudo-random distributions, and typically m is significantly smaller than n. The compressive sample, then, is a randomly weighted sum of the data. Representing the data in a sparse basis $\Psi \in \mathbb{R}^{n \times n}$ with coefficients s, then (1) becomes $$y = A\Psi s, \quad (2)$$

where x=Ψs. Given y (the measured results from an antenna under test), and A, an antenna radiation pattern can be generated. The coefficients are recovered through $\ell_1$ minimization with equality constraints $$\min \|s\|_1 \text{ subject to } y=A\Psi s. \tag{3}$$

In CS, A is typically a random or pseudo-random matrix, making each measurement a combination of signals from multiple probes. In the system shown in FIG. 1, randomization is accomplished by activating random combinations of switches simultaneously to randomly distribute transmission signals to the probes, resulting in a sensing matrix with a Bernoulli distribution. Alternatively, it is also possible to add devices to simultaneously modulate the gain and phase of each probe, giving a Gaussian distribution to the sensing matrix. CS theory states that if x is sparse, i.e., most of the values are close to zero, then x can be recovered with a small number of measurements.

Random sensing matrices have a low mutual-coherence μ, defined as the maximum coherence value $\mu_{ij}$, where $$\mu_{ij} = \frac{|d_i^T d_j|}{\|d_i\| \|d_j\|}, 1 \le i, j < N \text{ and } i \ne j. \tag{4}$$

In other words, μ is the largest absolute and normalized inner product between the columns in D=AΨ. The minimum number of measurements required to recover the original data is $$m \ge C\mu^2 \|s\|_0 \log n, \tag{5}$$

where C is a positive constant and $\|s\|_0$ is the $\ell_0$ norm, i.e. the number of nonzero values in s.

By vectorizing multi-dimensional data and using complex values to represent the phase and amplitude of the signals, the CS measurements for a single wavelength are represented by equation (2). Typically, complex numbers are handled by converting them to real values as $$A' = \begin{pmatrix} \mathcal{R}\{A\} & -\mathcal{J}\{A\} \\ \mathcal{J}\{A\} & \mathcal{R}\{A\} \end{pmatrix} \tag{6}$$

$$x' = \begin{pmatrix} \mathcal{R}\{x\} \\ \mathcal{J}\{x\} \end{pmatrix}, y' = \begin{pmatrix} \mathcal{R}\{y\} \\ \mathcal{J}\{y\} \end{pmatrix}. \tag{7}$$

Ψ is usually applied in the optimization process functionally, rather than calculated explicitly. Measurements at multiple wavelengths can be performed separately or at the same time, separating the measurements in the frequency domain, and then concatenating them into a single y vector and A matrix for data recovery. With this overview established, four different antenna pattern CS measurement architectures are described below.

Independent Spherical Measurements

Figure 2:
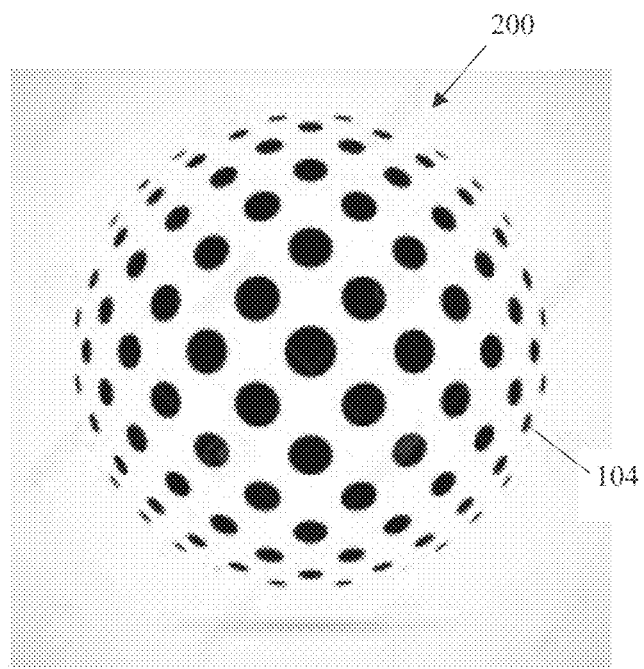
FIG. 2 is a schematic drawing of an embodiment of the invention where a plurality of probes are arranged in a sphere about the AUT and the AUT is static during measurements.
Figure 3:
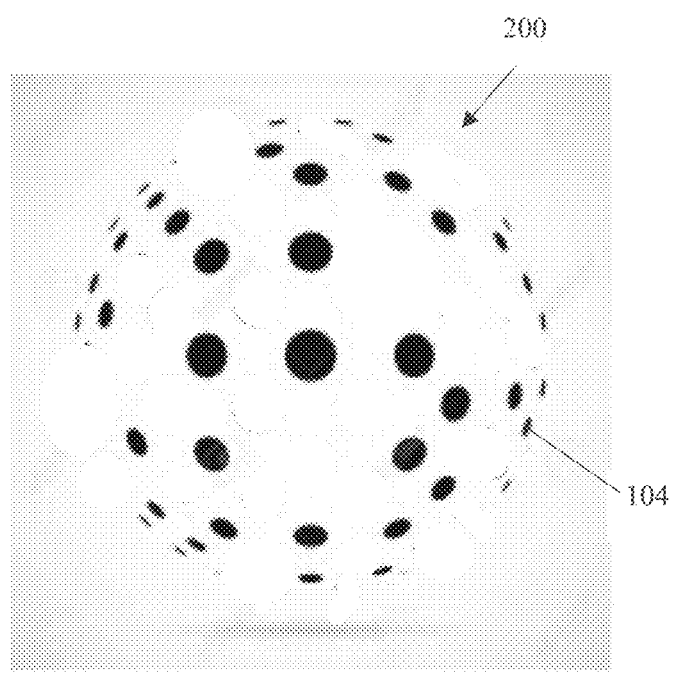
FIG. 3 is a schematic drawing of an embodiment of the invention where a plurality of probes are arranged in a sparse sphere about the AUT and the AUT is rotated between measurements.

The simplest scenario, although requiring the most resources, is to use a sphere of test antennas 104 all simultaneously transmitting signals with random phases and amplitudes. FIG. 2 schematically depicts the spherical antenna arrangement 200—the AUT 102 is positioned within a sphere of test antennas 104 (for clarity, not shown in FIG. 2). Each test antenna 104 is coupled to a transmitter (as shown in FIG. 1). The received signals are summed by the AUT 102 located at the center of the test antenna array and measured, creating a compressed signal. Note that this process can be reversed for reciprocal antennas, with the AUT transmitting to test antennas which scale and sum the received signals to create a compressed signal.

Starting with a single wavelength, the sensing matrix is $$A_\lambda = \begin{pmatrix} vec(F_\alpha)^T \\ \vdots \\ vec(F_\beta)^T \end{pmatrix} \lambda = 1, \ldots, n_\lambda \tag{8}$$

$$a = \frac{m}{n_\lambda}(\lambda + 1) + 1, \beta = \frac{m\lambda}{n_\lambda} \tag{9}$$

where λ indexes the range of $n_\lambda$ wavelengths, $F_k \in \mathbb{C}^{n_\theta \times n_\varphi}$ represents the amplitude and phases of the transmitting antennas as complex values during measurement k, m is the total number of measurements, and vec () is a vectorization operator. The complete sensing matrix for all wavelengths concatenates the $A_\lambda$ submatrices into a block diagonal matrix $$A = \begin{pmatrix} A_1 & 0 & 0 \\ \vdots & \ddots & \vdots \\ 0 & 0 & A_\lambda \end{pmatrix} \tag{10}$$

Measurement vector y can be generated from (1) by vectorizing the 3D ARP data into $x \in \mathbb{C}^{n \times 1}$, where the total size of the data is $n=n_\theta n_\varphi n_\lambda$. The complex values are converted to real values using (6) and (7), and sparse ARP coefficients can be recovered from (3). For noisy data, or data that is not completely sparse, the equality constraint can be relaxed to an inequality constraint $$\min \|s\|_1 \text{ subject to } \|A\Psi s - y\|_2 \le \varepsilon, \tag{11}$$

where ε is a user defined constant.

Rotating Spherical Measurements

In the previous system design, a large number of transmitter antennas and transmitters ($n_\theta \times n_\varphi$) are required to create the compressive samples. This number can be reduce by randomly distributing a fraction of these transmitters, $r_n$, around the AUT 102, and then rotating the AUT 102 between measurements. For higher resolutions the total number of transmitters can be reduced by factors as high as $r_n = 1/64$ without degrading performance. Even in the non-rotating case, activating only a fraction of transmitters at random locations performs well and reduces algorithm complexity.

Denote matrix $P \in \mathbb{Z}^{n_\theta \times n_\varphi}$ indicating the initial positions of the transmitting test antennas, where $p_{\theta\varphi}=1$ if the transmitter antenna is present, and $p_{\theta\varphi}=0$ if absent. $\theta=1, \ldots, n_\theta$ and $\varphi=1, \ldots, n_\varphi$ are indices of P. The rotation of the AUT is modeled as a row-wise, downward, circular shifting of P, using shifting matrix $H \in \mathbb{Z}^{n_\theta \times n_\theta}$ with rows $$h_\theta^T = \begin{cases} e_{n_\theta}^T, & \theta = 1 \\ e_{\theta-1}^T, & \theta \ne 1 \end{cases} \tag{12}$$

Figure 4:
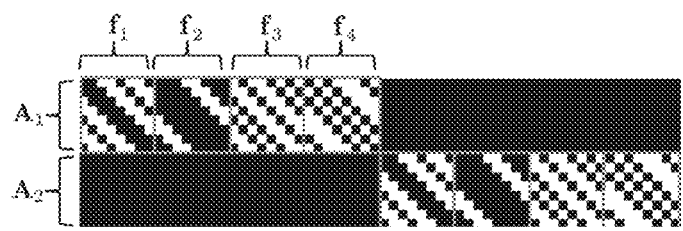
FIG. 4 is a visualization of an exemplary sensing matrix for the rotating spherical arrangement of FIG. 3.

For one wavelength, the sensing matrix is $$A_\lambda = \begin{pmatrix} vec(H^{\alpha-1} P_\alpha \odot F_\alpha)^T \\ \vdots \\ vec(H^{\beta-1} P_\beta \odot F_\beta)^T \end{pmatrix} \lambda = 1, \ldots, n_\lambda \tag{13}$$

where ⊙ signifies an element-wise operation and α and β are as in (9). The full sensing matrix is once again given by (10). Here the transmitters' signals are changed at each measurement, but they also can be changed once after each complete revolution of the AUT with little impact on performance. FIG. 4 is a visualization of the sensing matrix (A) with $$n_\theta = 8, n_\varphi = 4, n_\lambda = 2, r_n = \frac{1}{2}, \text{ and } m = 16;$$

with all nonzero values set to 1 for the purpose of the illustration. The 4 columns of $F_1$ are labeled, vectorized as the rows of $A_1$, with the columns rotating with each measurement.

Independent Circular Measurements

Figure 5:
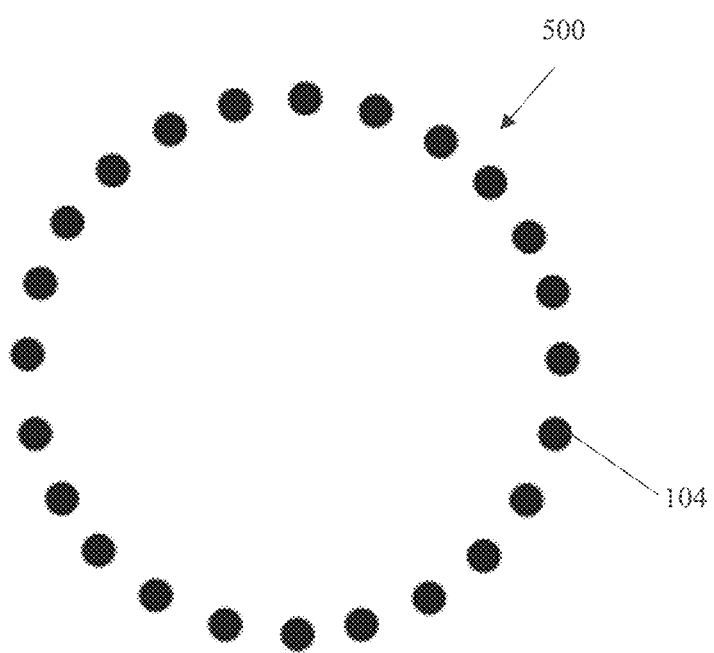
FIG. 5 is a schematic drawing of an embodiment of the invention where a plurality of probes are arranged in a ring about the AUT.

The number of transmitters and transmitting antennas can also be reduced by using a circular ring of transmitters along θ to create compressed measurements, and then rotating the AUT 102 along φ to capture the full ARP. FIG. 5 depicts a schematic of the circular array 500 of test antennas 104. Matrix $F_k$ is replaced by vector $f_k \in \mathbb{C}^{n_\theta \times 1}$, with $$m_\theta = \frac{m}{n_\theta n_\lambda} \quad (14)$$

measurements for each angle of φ. Each $A_\lambda$ now has its own submatrices representing the measurements at each φ angle $$B_{\ell\lambda} = \begin{pmatrix} f_\alpha^T \\ \vdots \\ f_\beta^T \end{pmatrix} \quad \ell = 1, \ldots, n_\varphi \quad \lambda = 1, \ldots, n_\lambda \quad (15)$$

$$a = m_\theta n_\varphi(\lambda - 1) + m_\theta(\ell - 1) + 1 \quad (16)$$

$$\beta = m_\theta n_\varphi(\lambda - 1) + m_\theta \ell \quad (17)$$

where λ identifies the wavelength and ℓ identifies the φ angle. This places $B_{\ell\lambda}$ the $\ell^{th}$ submatrix in $A_\lambda$. $A_\lambda$ now also has a block diagonal structure $$A_\lambda = \begin{pmatrix} \beta_{1\lambda}^T & 0 & 0 \\ \vdots & \ddots & \vdots \\ 0 & 0 & \beta_{n_\varphi\lambda}^T \end{pmatrix} \quad (18)$$

with the final sensing matrix given by (10).

Rotating Circular Measurements

Figure 6:
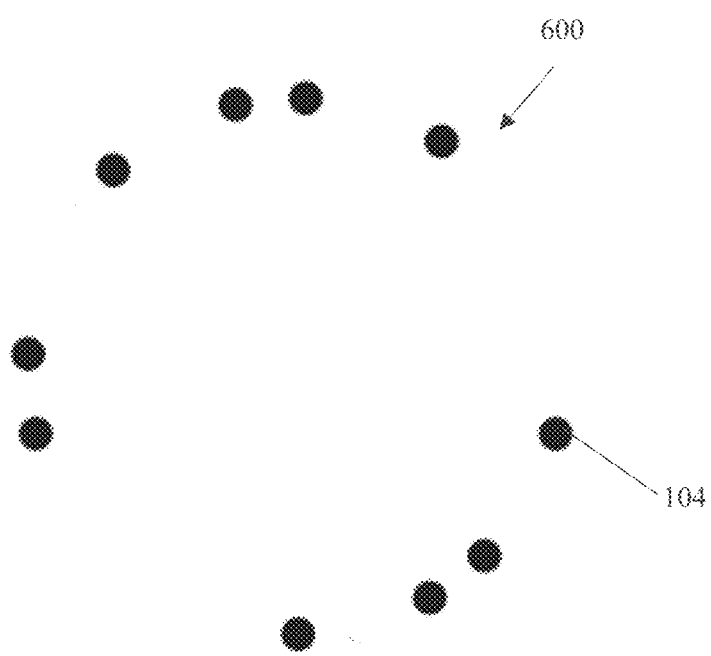
FIG. 6 is a schematic drawing of an embodiment of the invention where a plurality of probes are arranged in a sparse ring about the AUT.

As in the spherical case, if the AUT 102 is rotated $m_\theta$ times in θ, in addition to the rotations in φ, only a fraction $r_n$ of the transmitters and transmitting antennas are needed. FIG. 6 depicts a schematic of a sparse circular array 600 of test antennas 104.

Instead of encoding the rotation into matrix P, the rotation is now represented by vector $P \in \mathbb{Z}^{n_\theta \times 1}$, with $$\beta_{\ell\lambda} = \begin{pmatrix} (H^{\alpha-1} p \odot f_\alpha)^T \\ \vdots \\ (H^{\beta-1} p \odot f_\beta)^T \end{pmatrix} \quad (19)$$

using the same definitions of ℓ, λ, α, and β as in (15-17). $A_\lambda$ and A are then formed using (18) and (10) respectively.

Figure 7:
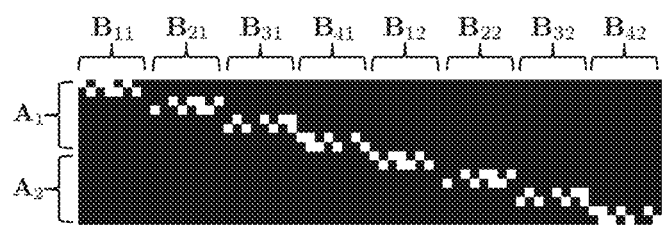
FIG. 7 is a visualization of an exemplary sensing matrix for the rotating circular arrangement of FIG. 6.

FIG. 7 is a visualization of the sensing matrix (A) with $$n_\theta = 8, n_\varphi = 4, n_\lambda = 2, r_n = \frac{1}{2}, \text{ and } m = 16;$$

with all non-zero value set to 1. The labeled $B_{\ell\lambda} \in \mathbb{C}^{2\times 8}$ submatrices are composed of the antenna placements f that circularly shift to the right with each measurement.

Sensing Matrix Optimization

Equation (5) states that the number of measurements required to accurately recover data from compressive samples is proportional to the square of the coherence of the sensing matrix. Although random elements generally provide low coherence, optimization methods can be used to lower this coherence further, thereby increasing CS performance. Starting with D=AΨ for only one wavelength, the columns are normalized as $d_n = d/\|d\|_2$ to produce $D_n$. The coherence values $\mu_{ij}$ are the off diagonal elements of the Gram matrix, $G = D_n^T D_n$. Coherence values greater than the theoretical minimum $$\mu_{min} = \sqrt{\frac{n-m}{m(n-1)}} \quad (20)$$

can be lowered closer to $\mu_{min}$ by $$\mu'_{ij} = \gamma\mu_{ij} + \text{sign}(\mu_{ij})(1-\gamma)\mu_{min}, \ 0<\gamma<1 \quad (21)$$

to create a new G' with lower coherence. Finally, QR factorization is used to extract D' and finally A' and G'. The process is repeated, reducing μ with each iteration. The final optimized A' can then be converted to real values with (6) and used across all of the wavelengths for every $A_\lambda$ since wavelengths are independent in the measurement process. This method cannot be directly applied to the rotating architectures since A has a predefined structure. A form of binary search with other metrics than coherence might be applicable to these cases.

Simulation Results

Figure 8:
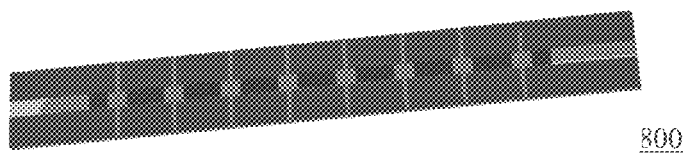
FIG. 8 depicts an AUT model used to simulate embodiments of the invention.
Figure 9:
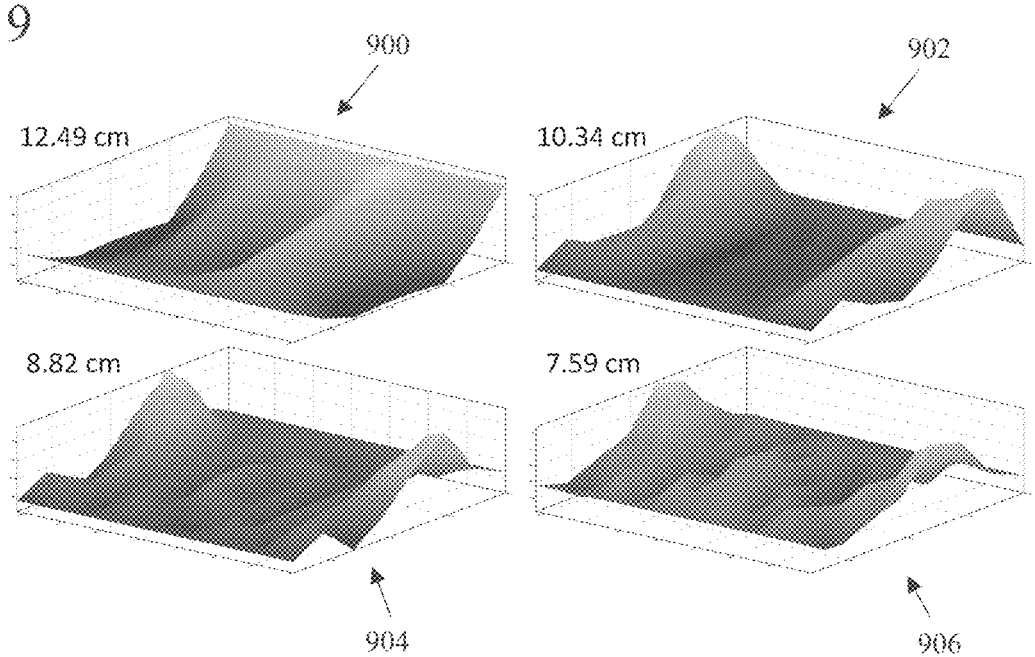
FIG. 9 depicts the ARP used in the simulation at four wavelengths.
Figure 10:
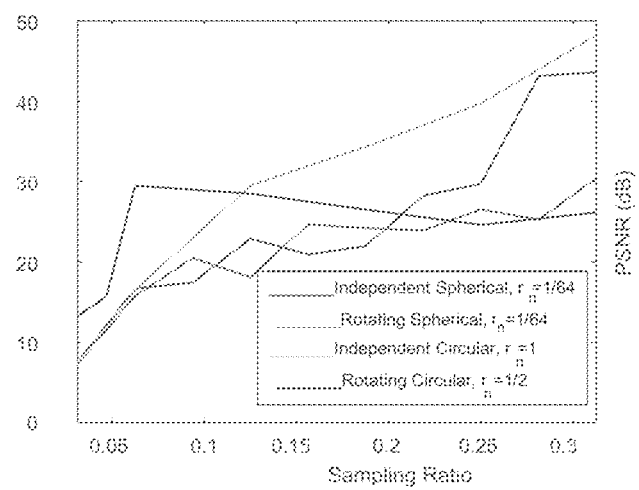
FIG. 10 is a plot of peak signal to noise ratio found for each of the four embodiments using amplitude and phase measurements in FIGS. 2, 3, 5 and 6.

The four CS architectures (using test antenna arrays: spherical, sparse spherical, circular, sparse circular) outlined above were simulated over a range of sampling ratios. The AUT used in the simulation is a leaky wave antenna based on a composite right left-handed transmission line. The ARP was generated using openEMS and used as test data. The AUT model is shown in FIG. 8, with the ARP of four wavelengths shown in FIG. 9—900 shows the ARP at a 12.49 cm wavelength, 902 shows the ARP at a 10.34 cm wavelength, 904 shows the ARP at an 8.82 cm wavelength and 906 shows the ARP at a 7.59 cm wavelength. Observe that the ARP changes significantly with wavelength, although the gradual changes leave the 3D data relatively sparse. Simulations used a resolution of $n_\theta=64$, $n_\varphi=32$, and $n_\lambda=32$ spanning a range of 12.49 cm to 7.59 cm (2.4 GHz to 3.95 GHz). With this amount of data, the sensing matrix can be very large. Using a sampling ratio of 0.25, gives an $A \in \mathbb{R}^{16384 \times 16384}$, which can consume up to 8.59 GB of storage when using double precision floating point numbers.

Due to the block diagonal structure of A for these architectures, many of the elements are zero, and calculations can be accelerated by taking advantage of the sparsity of the sensing matrix. As mentioned above, this sparsity can be increased not only by removing transmitters in the rotating cases, but also by randomly disabling a number of the transmitters in the independent scenarios. The fraction of transmitters used for each case, $r_n$, is listed in the plot legend of FIG. 10. The real and imaginary components of the sensing matrix were taken from N(0,1), and ε was set to $10^{-3}\|y'\|_2$. The discrete Fourier transform was used as the sparse basis. For each architecture, for each sampling ratio, the results of four simulations were averaged to produce the plots in FIG. 10. Results range from the rotating circular architecture achieving a peak signal to noise ratio (PSNR) of 30 dB using a sampling ratio of only $r_m=0.0625$, to the rotating spherical architecture requiring $r_m=0.3125$ to achieve 30 dB, which is a considerable savings compared to the total data size.

Figure 11:
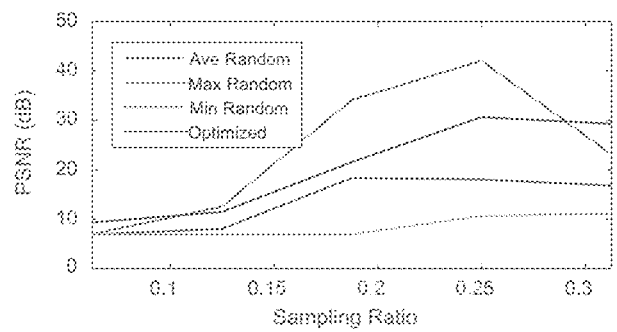
FIG. 11 is a plot of peak signal to noise ratio found for the embodiment in FIG. 2 using amplitude and phase measurements and a sensing matrix optimization technique is applied.

The sensing matrix optimization algorithm was also verified in simulation. FIG. 11 shows the results of a small test case of the independent circular (IS) scenario with $n_\theta=16$, $n_\varphi=8$, and $n_\lambda=8$ across a range of sampling ratios. For comparison, five random sensing matrices were simulated, with the maximum, minimum, and average PSNR of the recovered patterns plotted. On average, the optimized A performed better than the random ones, although there were random matrices that did perform better than the optimized matrix. It is likely that by chance these random matrices were able to capture the sparse coefficients of the test data well, but would not perform as well as the optimized system for other data sets.

Comparison to Traditional Techniques

In order to appreciate the benefits of CS, traditional ARP measurement techniques are compared to CS techniques. Table I shows a basic comparison of three architectures using traditional sampling: a sphere of transmitters (TS), a circle of transmitters (TC), and a transmitter at a single point (TP). The term "transmitters" refers to transmitting test antennas. Details such as whether or not each antenna has a separate transmitter, or if there is one transmitter and a multiplexing scheme, is not considered here. $n_\lambda$ is excluded from these values, since it is assumed that multiple wavelengths can be captured simultaneously. Using traditional sampling, the total number of samples taken is always the same, dictated by the Nyquist criteria. $t_m$ denotes movement time and is sampling time, which is typically much smaller than $t_m$. The comparison among traditional sampling architectures is straightforward, increasing the number of transmitters decreases the amount of movement of the AUT, thereby decreasing total measurement time.

Table II shows a comparison of the CS architectures: independent spherical (IS), rotating spherical (RS), independent circular (IC), and rotating circular (RC) measurements. The row headings are abbreviated versions of the headings in Table I. The fraction of transmitters used, $r_n$, varies depending on the architecture. The sampling ratio, $r_m$, also depends on the architecture, and should be set to meet a given performance threshold. For simplicity, when deriving the sensing matrix of RS, it was assumed that the AUT rotated between each measurement. But it is equivalent for norm measurements to be taken at each position, only moving a total of $n_\theta$ times. The same reasoning explains the $n_\varphi$ used as the number of movements for IC.

The varying values of $r_n$ and $r_m$, along with the added complexity of rotation, makes analysis of the CS methods more complicated than the traditional sampling methods. To facilitate analysis, example values for Tables I and II were calculated and displayed in Table III. The calculations used the simulation parameters from section VI, $t_m=3.0$ s and $t_s=0.1$ s, and a performance threshold of approximately 30 dB. Using the results in FIG. 10, $r_m$ was set to 0.25, 0.3125, 0.125, and 0.0625 for IS, RS, IC, and RC respectively. Although these results only reflect a single antenna pattern, the pattern is fairly complex and should represent a fair test case for evaluation. Further research is necessary to determine appropriate values of $r_m$ for various antenna types. The fastest CS method, IS, is about 4 times faster than the fastest traditional method using the same number of transmitters. The lowest cost method is the traditional, single transmitter system, but it also has by far the longest measurement time. The next least expensive methods are RS and RC, with RS having the shortest measurement time for this example, beating the comparable traditional method TC in both cost and measurement time. IC is more expensive than RS, but is also more than twice as fast, making it a preferred choice when speed outweighs cost considerations. This high-level comparison clearly demonstrates the advantage of using CS for ARP measurement.

Phase Retrieval

The ARP measurement system of FIG. 1 in combination with spherical and circular probe arrays of FIGS. 2, 3, 20, and 21 as described above may be used to determine phase of the radiation pattern using amplitude only measurements in at least one embodiment of the invention. Phase retrieval is the process of retrieving a complex valued signal with magnitude and phase information from amplitude-only measurements. Compressive Phase Retrieval via Lifting (CPRL) is used here to introduce the concept of compressive phase retrieval.

Phase retrieval can be expressed as $$\text{find } x \text{ subj. to } y=|Ax|^2, \tag{22}$$

where the measurements in (22) are now only magnitudes and x is determined up to a global phase factor g. This typically inconsequential phase factor cannot be determined since any phase will produce the same magnitude measurements $$|Ax|^2=|Axe^{ig}|^2. \tag{23}$$

When calculating the error of simulated results, the global phase factor for each wavelength $g_\lambda$ of the recovered pattern $\hat{x}_\lambda$ is calculated using the known true pattern $x_\lambda$ and used to align the data. $g_\lambda$ is calculated as $$g_\lambda = \tan^{-1}\left(\frac{\Im\{x_\lambda \hat{x}_\lambda^T\}}{\Re\{x_\lambda \hat{x}_\lambda^T\}}\right). \tag{24}$$

Compressive phase retrieval uses the $\ell_1$-norm to reduce the number of measurements required for signal recovery just as CS in (3)

$$\min_x \|x\|_1 \text{ subj. to } y = |Ax|^2. \tag{25}$$

This can be transformed into a semidefinite program by first casting (25) as $$\min_X \|X\|_1$$

$$\text{subj. to } y_i=a_i X a_i^H, i=1,\ldots,n,$$

$$\text{rank}(X)=1, X \succeq 0, \tag{26}$$

where $a_i$ are the rows of A and $X=xx^H$. Trace-norm relaxation is used to remove the rank constraint giving $$\min_X Tr(X)+\gamma\|X\|_1$$

$$\text{subj. to } y_i=Tr(\Phi_i X), i=1,\ldots,n,$$

$x \succeq 0,$ (27)

where $\Phi_i = a_i^H a_i \in \mathbb{Z}^{n \times n}$ and $\gamma$ is a positive valued design parameter. x is then recovered by computing the rank-1 decomposition of X through single value decomposition (SVD).

Other compressive phase retrieval algorithms include an alternating minimization (AltMin) approach, the GrEedy Sparse PhAse Retrieval (GESPAR) algorithm, and compressive phase retrieval via generalized approximate message passing (PR-GAMP). PR-GAMP has been shown to outperform other algorithms both in terms of success rate and runtime, and is used here as an example of an efficient implementation of compressive phase retrieval. GAMP is designed to solve measurement models of the form $y = q(Ax + w),$ (28)

where $q(\cdot)$ is a component-wise nonlinearity and w is random noise. Assuming x and w are independent, the posterior probability density function $p(x|y) \propto p(y|x) p(x)$ (29)

can be factored as $p(x|y) \propto \Pi_{i=1}^m p_{Y_i|Z}(y_i | [Ax]_i) \Pi_{j=1}^n p_{X_j}(x_j)$ (30)

and solved via loopy belief propagation. PR-GAMP is accomplished using a likelihood function for phase retrieval and a sparse Bernoulli-Gaussian signal prior. The exemplary implementation employed here estimates noise variance and signal sparsity parameters during execution, and uses, for example, a minimum of ten restarts to help avoid poor local minima.

Antenna Pattern Measurement with Compressive Phase Retrieval

Spherical Architectures with Phase Retrieval

Phase retrieval is presented for the IS probe architecture (FIG. 2) first, demonstrating three results which will also be applicable to the other architectures. First, it is shown that increasing the number of wavelengths in the phase retrieval problem may hinder performance. Second, phase retrieval works well using combinations of probes without any additional random modulation. Third, only a few probes need to be combined for each measurement for successful phase retrieval.

Figures 12, 13:
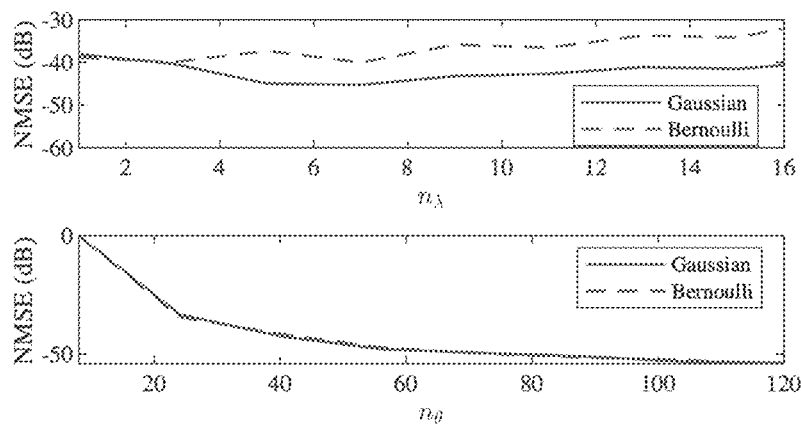
FIG. 12 depicts the NMSE of the IS architecture as the size of the pattern increases for Gaussian and Bernoulli signals, where $n_\theta$ and $n_\varphi$ are held constant while $n_\lambda$ increases.
FIG. 13 depicts the NMSE of the IS architecture as the size of the pattern increases for Gaussian and Bernoulli signals, where $n_\theta$ and $n_\varphi$ increase while $n_\lambda$ is held constant at a single wavelength.
Figure 14:
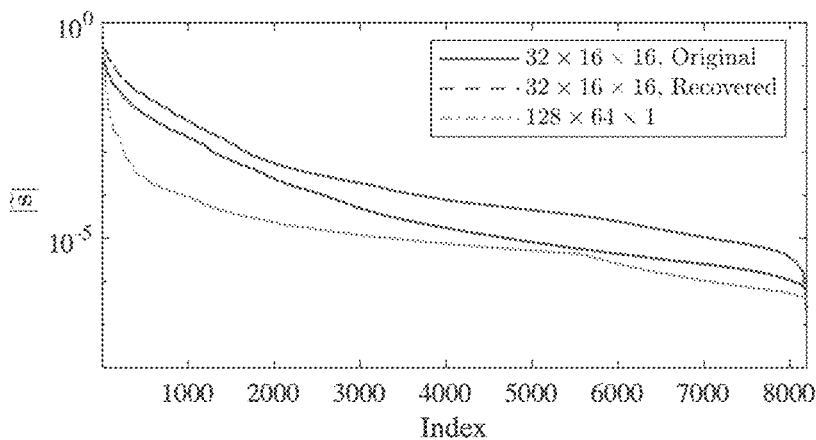
FIG. 14 depicts DFT coefficients of the example antenna pattern sorted in descending order.

In various embodiments, the IS architecture used for CS with complex measurements can be directly applied to amplitude-only measurements. Initial phase retrieval simulations were performed characterizing normalized mean squared error (NMSE) as the size of the antenna pattern increases. The example antenna pattern used 16 wavelengths spanning a range of 12.3 to 15.8 cm and a sampling ratio of 0.6, i.e., m=0.6n. Results are shown in FIGS. 12 and 13 for Gaussian and Bernoulli sensing matrices, respectively. Both plots show the NMSE of the IS architecture as the size of the pattern increases for Gaussian and Bernoulli signals. In FIG. 12, $n_\theta$ and $n_\phi$ are held constant while $n_\lambda$ increases. In FIG. 13, $n_\theta$ and $n_\phi$ increase while $n_\lambda$ is held constant at a single wavelength. As mentioned above, the Gaussian sensing matrix, although not very practical, it usually has the best performance and is a useful bound on system error. Each measurement has a ratio of $r_s = 4/n$ active probes for the top plot, and $r_s = 25/n$ for the bottom plot. In the top plot $n_\lambda$ increases from 1 to 16, with $n_\theta = 32$ and $n_\phi = 16$ held constant. The number of populated probes is $r_n = 1$. Note the distinction made between the two ratios $r_n$ and $r_s$ when performing phase retrieval. $r_n$ is the ratio of the physically populated probes to the maximum possible number of probes for a given architecture. $r_s$ is the ratio of the number probe signals combined during each measurement to the total number of probes. In the Gaussian case, the error remains about the same, while in the Bernoulli case, the error increases with $n_\lambda$. These results are surprising. Since the pattern only changes slightly from one wavelength to the next, measuring more wavelengths should increase the overall sparsity of the pattern, which should improve performance. This is demonstrated in FIG. 13, where the number of wavelengths is held constant at $n_\lambda = 1$ at 15.8 cm while ne increases, with $n\phi = n_\theta/2$. As the resolution of the pattern increases, there are larger regions of smooth transitions, increasing the sparsity of the data and thereby improving performance. The probable explanation of why additional wavelengths does not increase performance is that since each wavelength of the pattern is recovered with an arbitrary global phase factor, the pattern cannot be considered sparse along the wavelength dimension. FIG. 14 illustrates this phenomenon. Three data sets of normalized DFT coefficients, $|\tilde{s}|$, are sorted and shown in descending order, where the tilde denotes normalization. The first is the coefficients of an original $n_\theta = 32$, $n_\phi = 16$, and $n_\lambda = 16$ pattern, with the phases of each wavelength aligned. The second is an accurately recovered pattern, except that each wavelength has an arbitrary global phase factor. These phase factors perturb the data, decreasing the sparsity, i.e., increasing the magnitude of the DFT coefficients. The last plot (bottom) is the DFT coefficients of a $n_\theta = 128$, $n_\phi = 64$, and $n_\lambda = 1$ pattern shown for comparison. This data set happens to be even sparser than the original data set with 16 wavelengths.

Even though the wavelength dimension does not increase the sparsity of the data, the bottom plot of FIG. 13 shows that the pattern can still be recovered accurately with relatively few measurements using a single wavelength. Due to this result, the remainder of this description only considers recovery of a single wavelength at a time. The rest of this section uses the example pattern at =15.8 cm.

Figure 15:
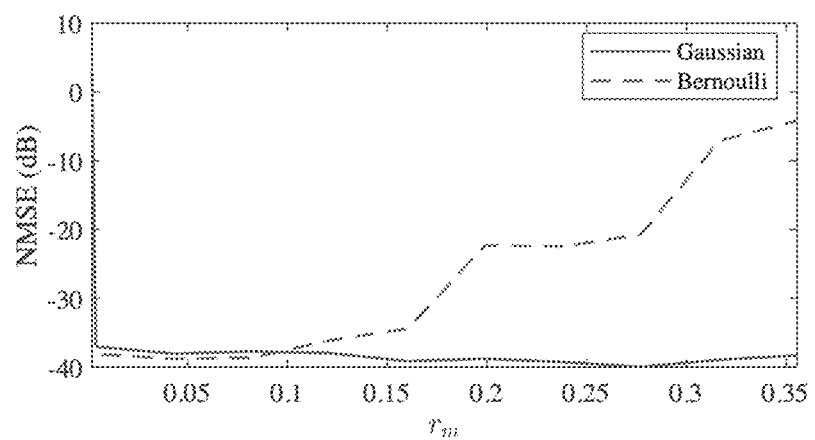
FIG. 15 depicts the NMSE vs. the fraction of active probes $r_m$ for $n_\theta=32$ and $n_\varphi=16$, with both Gaussian and Bernoulli sensing matrices using a sampling ratio of 0.6.

FIG. 15 depicts the NMSE vs. the fraction of active probes $r_s$ for $n_\theta = 32$ and $n_\phi = 16$, with both Gaussian and Bernoulli sensing matrices using a sampling ratio of 0.6. Note that for this sampling ratio, recovery fails for the smallest value of $r_s = 1/n$, i.e., only one probe. Otherwise, error is fairly independent of $r_s$ for the Gaussian case, while error increases for larger values of $r_s$ for Bernoulli sensing matrices. Based on this result, $r_s$ is set such that only 4 probes are combined per measurement for rest of the simulations in this section.

Figure 16:
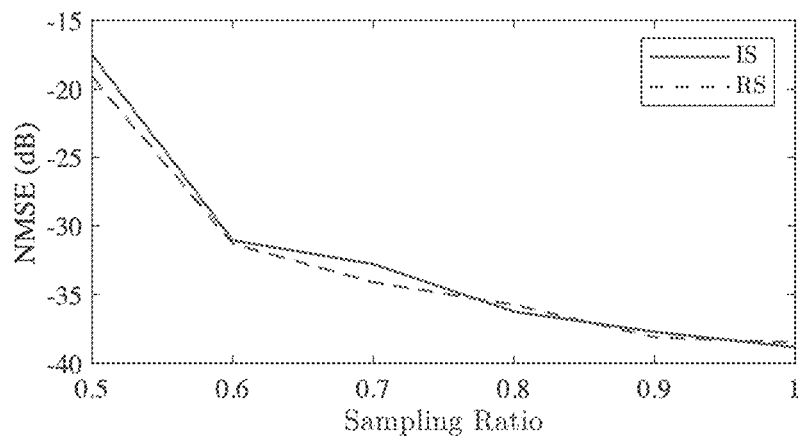
FIG. 16 shows NMSE vs. the sampling ratio m/n for IS and RS probe arrays.
Figure 17:
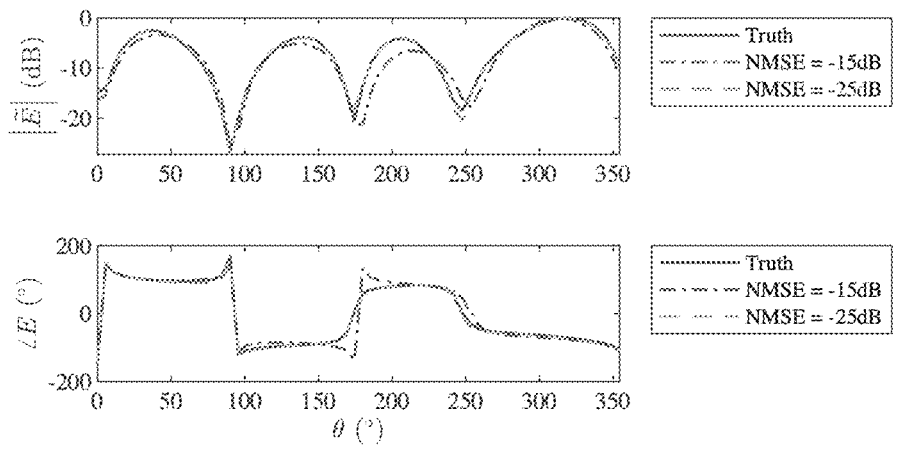
FIG. 17 depicts a comparison of the true and recovered magnitude and phase patterns in the elevation plane for two example NMSE values.
Figure 18:
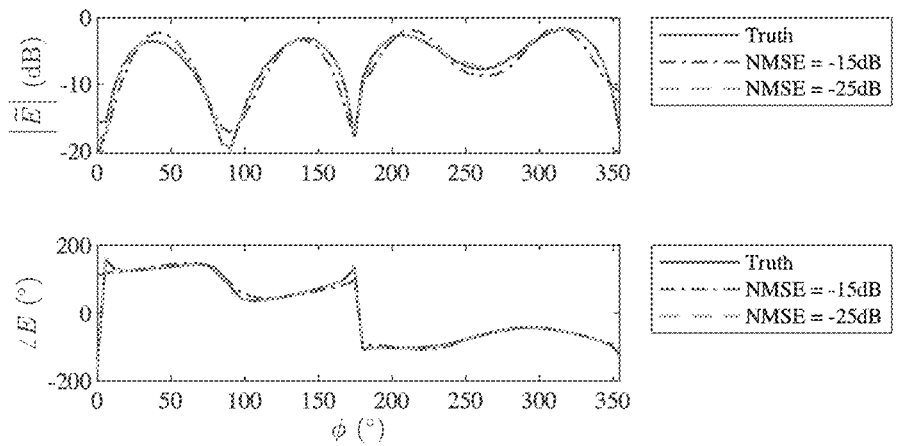
FIG. 18 depicts recovered magnitude and phase patterns in the azimuth plane for two example NMSE values.

The system parameters determined for IS can be directly applied to RS. FIG. 16 shows NMSE vs. the sampling ratio m/n for IS and RS. The ratio of populated probes for RS is $r_n = 2/n_\phi$. RS achieved performance similar to IS using only a fraction of the number of probes. Pattern cuts for two example NMSE levels are shown in FIGS. 17 and 18. FIG. 17 shows the elevation plane while FIG. 18 shows the azimuth plane. A visual examination shows that even the −15 dB NMSE results resemble the original pattern. The largest phase errors occur in the nulls, where the phase is changing quickly and small variations of real and imaginary values result in large errors. In many instances the main and side lobes are of greater interest than the nulls, so these errors have little practical importance. The −25 dB NMSE reconstruction closely matches the original pattern, even in these nulls. These two NMSE values were only chosen as examples, but the system is capable of achieving lower error, as shown in FIG. 16.

Circular Architectures with Phase Retrieval

Figure 19:
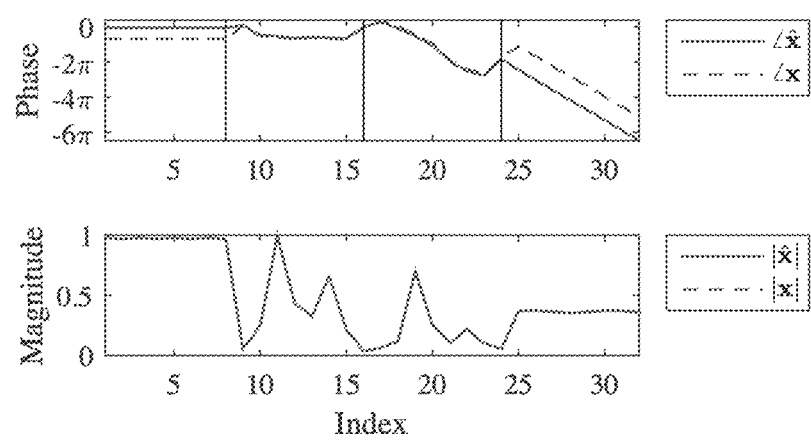
FIG. 19 depicts an example of compressive phase retrieval using the same IC apparatus as was used for complex measurements.

Applying compressive phase retrieval to the circular architectures was more challenging than the spherical architectures. Initial attempts made no changes to the physical apparatus shown in FIGS. 2, 3, 5 and 6, resulting in the same sensing matrix structure shown in FIGS. 4 and 7. FIG. 19 shows a typical simulation result for IC, using $n_\theta=8$, $n_\phi=4$, and a Gaussian sensing matrix. The pattern is vectorized with each circle of 8 measurements along $\theta$ grouped together for the 4 rotations in $\phi$. Vertical lines are added to the phase plot to separate each rotation in $\phi$. Although the magnitude of the recovered pattern NI matches that of the original pattern |x|, the phase was not successfully recovered. On closer inspection, each of the four rotations in appear to match the true phase with the addition of a phase offset.

The source of this problem is that the sensing matrix given by (18) leads to a block diagonal structure. Each block is a separate set of equations, and can therefore have its own arbitrary phase factor $g^\ell$.

$$y = \left| \begin{pmatrix} B^1 & 0 & \cdots & 0 \\ 0 & B^2 & \ddots & \vdots \\ \vdots & \ddots & B^3 & 0 \\ 0 & \cdots & 0 & B^4 \end{pmatrix} \begin{pmatrix} x^1 e^{ig^1} \\ x^2 e^{ig^2} \\ x^3 e^{ig^3} \\ x^4 e^{ig^4} \end{pmatrix} \right|^2 \quad (31)$$

where $\mathbf{x}^\ell$ is the pattern at rotation $\ell$ in $\phi$ and the $\lambda$ subscript has been removed, since only one wavelength is being considered. This caused the phase retrieval failure in FIG. 19. Each $\mathbf{x}^\ell$, separated by vertical lines in the figure, has a different phase factor, perturbing the recovered results.

Figure 20:
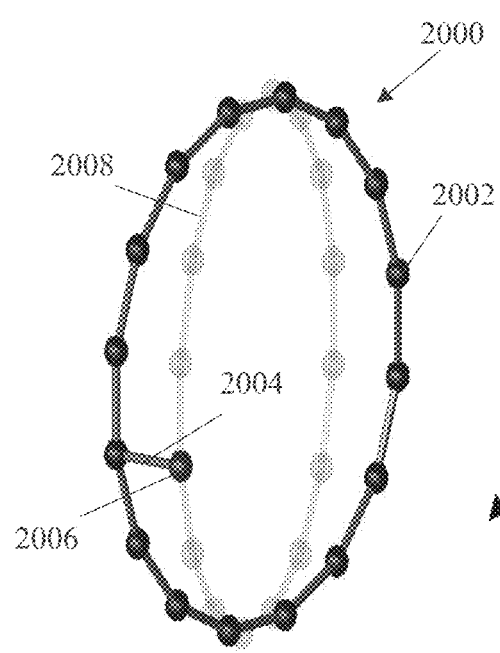
FIG. 20 depicts an embodiment of an array of test probes for use in performing IC amplitude only measurements.

To solve this problem, an adjustment is made to the IC measurement apparatus. FIG. 20 illustrates a circle 2000 of probes 2002 along 9 as dots on the circle, and a leg 2004 with an additional probe 2006. As such, the additional probe 2006 is located out of the plane of the circle 2000 of probes 2002. The circle 2008 shows the position of the probes 2002 at the next rotation in $\phi$. In this illustration, it is easier to view the circle of probes as rotating, which is equivalent to the rotation of the AUT. The probe 2006 is placed so that it overlaps one of the measurements in the next rotation. This overlap breaks the block diagonal structure of the full sensing matrix. (31) no longer holds, and there is only one possible phase factor for the entire data set, as in (23).

Figure 21:
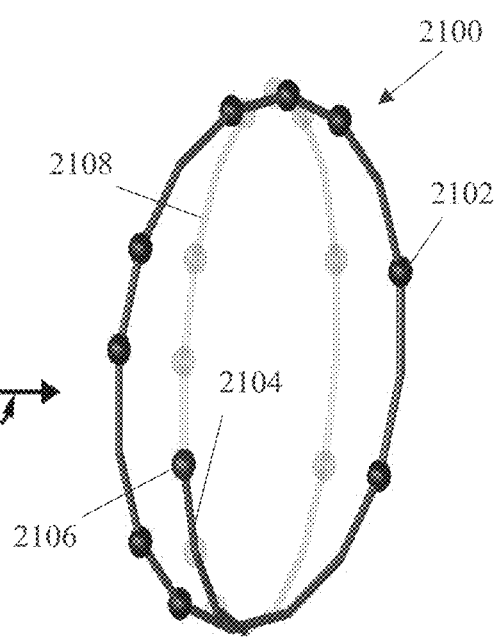
FIG. 21 depicts an embodiment of an array of test probes for use in performing RC amplitude only measurements.

RC suffers from the same problem as IC and can be solved in a similar manner. In RC, a sparse circle of probes rotates in $\phi$ and $\theta$. If the extra probe is attached the same way as shown in FIG. 20 for IC, it will rotate in $\theta$ along with the circle. This does not allow the extra probe to acquire a sufficient number of measurements at any single point in $\theta$ to make a reliable reference for phase alignment. Instead, the apparatus is modified as shown in FIG. 21, to create a circle 2100 of probes 2102 with an extra probe 2106 supported separately and out of the plane of the circle 2100 by leg 2104. In this way, the probe 2106 remains stationary during rotations in $\theta$ and only rotate together with the circle 2100 in $\phi$ (next rotation shown as circle 2108). Of course, the configuration for RC works for IC as well, but separate embodiments are presented to emphasize the difference between the architectures.

Since only one wavelength is being used, (18) is now the full sensing matrix for IC and RC, and the $\lambda$ subscript can be removed. For the last rotation in $\phi$, the extra probe 2006/2106 becomes the first location in $\theta$ in the first rotation in $\phi$. For all other rotations, the extra probe 2006/2106 appears at the last location in $\theta$ in the next rotation in $\phi$. Thus, the extra probe $f_i$ is placed into A corresponding to submatrix $\mathbf{B}^\ell$ as $$a_{ij} = f_i \quad (32)$$

for $$i = m_\theta(\ell - 1) + 1, \ldots, m_\theta \ell \quad (33)$$

$$j = \begin{cases} 1, & \text{if } \ell = n_\phi \\ n_\theta(\ell + 1), & \text{otherwise} \end{cases} \quad (34)$$

Figure 22:
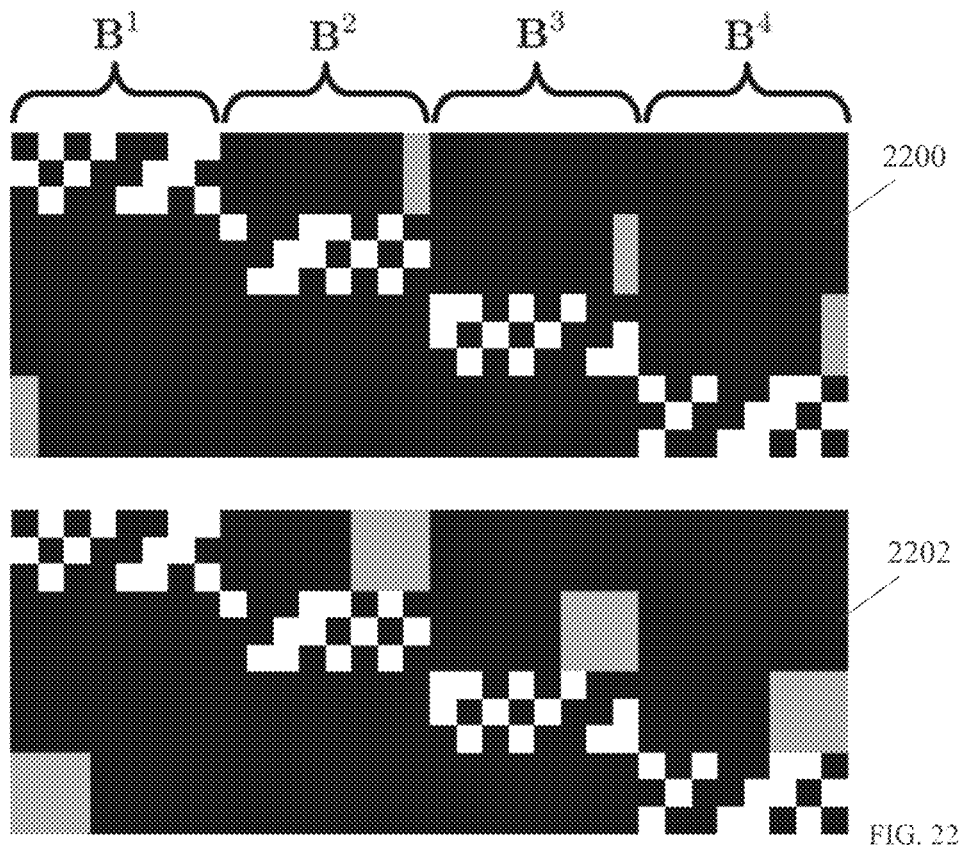
FIG. 22 is a visualization of A for RC with $n_\theta=8$, $n_\varphi=4$, $r_n=½$, and m=12 using the probe array of FIG. 20.

The top plot 2200 of FIG. 22 shows a visualization of A for RC with $n_\theta=8$, $n_\phi=4$, $r_n=\frac{1}{2}$, and m=12 with one probe added on a leg as in FIG. 20. For illustration, all of the probes are active, with the $\mathbf{B}^\ell$ sub-matrices shown in black and white and the measurements from the extra probe shown in gray. The rotation of the circle is modeled as circular shift to the left. The extra probe ensures that there is always an overlap in the sensing matrix between rotations in $\phi$, which breaks the block diagonal structure and eliminates phase ambiguities. The IC sensing matrix appears similar, except that the rows of $\mathbf{B}^\ell$ are random instead of shifting.

Figure 23:
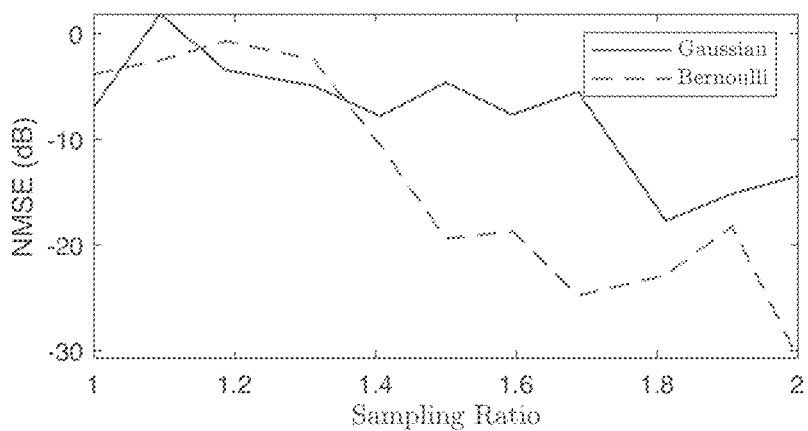
FIG. 23 shows the NMSE vs. sampling ratio for the IC architecture using the probe array of FIG. 20, for both Gaussian and Bernoulli sensing matrices.
Figure 24:
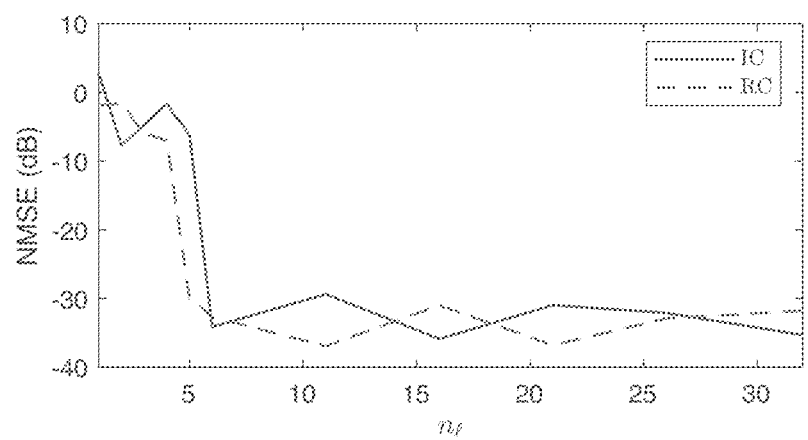
FIG. 24 shows the NMSE vs. the number of extra probes ne for IC and RC using m=n measurements and $r_n=½$ for RC.

FIG. 23 shows the NMSE vs. sampling ratio for the IC architecture with one probe on the extra leg, for both Gaussian and Bernoulli sensing matrices. The performance is a little erratic, but accurate pattern recovery does occur when enough measurements are taken. In order to achieve better performance, additional probes can be added to the extra leg along B to provide stronger coherence between each rotation in $\phi$. The bottom plot 2202 of FIG. 22 shows the structure of an example sensing matrix with three additional probes. FIG. 24 shows the NMSE vs. the number of extra probes $n_\ell$ for IC and RC using m=n measurements and $r_n=\frac{1}{2}$ for RC. The maximum of $n_\ell=n_\theta$ additional probes forms a complete second ring next to the first. In this case, low error is achieved at around $n_\ell=6$ extra antennas for both architectures. Although the results presented here placed the extra probes around $\theta$, they can also be placed along with similar results.

The foregoing architectures have been found to be stable in the presence of noise.

Here multiple examples have been given to illustrate various features and are not intended to be so limiting. Any one or more of the features may not be limited to the particular examples presented herein, regardless of any order, combination, or connections described. In fact, it should be understood that any combination of the features and/or elements described by way of example above are contemplated, including any variation or modification which is not enumerated, but capable of achieving the same. Unless otherwise stated, any one or more of the features may be combined in any order.

As above, figures are presented herein for illustrative purposes and are not meant to impose any structural limitations, unless otherwise specified. Various modifications to any of the structures shown in the figures are contemplated to be within the scope of the invention presented herein. The invention is not intended to be limited to any scope of claim language.

Where "coupling" or "connection" is used, unless otherwise specified, no limitation is implied that the coupling or connection be restricted to a physical coupling or connection and, instead, should be read to include communicative couplings, including wireless transmissions and protocols.

Any block, step, module, or otherwise described herein may represent one or more instructions which can be stored on a non-transitory computer readable media as software and/or performed by hardware. Any such block, module, step, or otherwise can be performed by various software and/or hardware combinations in a manner which may be automated, including the use of specialized hardware designed to achieve such a purpose. As above, any number of blocks, steps, or modules may be performed in any order or not at all, including substantially simultaneously, i.e., within tolerances of the systems executing the block, step, or module.

Where conditional language is used, including, but not limited to, "can," "could," "may" or "might," it should be understood that the associated features or elements are not required. As such, where conditional language is used, the elements and/or features should be understood as being optionally present in at least some examples, and not necessarily conditioned upon anything, unless otherwise specified.

Where lists are enumerated in the alternative or conjunctive (e.g., one or more of A, B, and/or C), unless stated otherwise, it is understood to include one or more of each element, including any one or more combinations of any number of the enumerated elements (e.g., A, AB, AC, ABC, ABB, etc.). When "and/or" is used, it should be understood that the elements may be joined in the alternative or conjunctive.

While the foregoing is directed to embodiments of the present invention, other and further embodiments of the invention may be devised without departing from the basic scope thereof, and the scope thereof is determined by the claims that follow.

The invention claimed is:

1. Apparatus for measuring antenna radiation patterns comprising:
an array of test antennas;
an antenna under test located proximate to the array of test antennas;
a compressive sensing processor coupled to the antenna under test and the array of test antennas to control signals emitted and received by the antenna under test and the array of test antennas, processing the received signals using compressive sensing and producing an antenna radiation pattern for the antenna under test, where the received signals comprises either amplitude only signals or amplitude and phase signals
wherein the array of test antennas is a spherical array.

2. The apparatus of claim 1, wherein the array of test antennas is a sparse spherical array.

3. The apparatus of claim 1, wherein, for received signals comprising amplitude and phase signals, the array of test antennas comprises a circular array and, for received signals comprising amplitude only signals, the array of test antennas comprises a circular array having an additional offset antenna located out of the plane of the circular array.

4. The apparatus of claim 1, wherein, for received signals comprising amplitude and phase signals, the array of test antennas comprises a sparse circular array and, for received signals comprising amplitude only signals, the array of test antennas comprises a sparse circular array having an additional offset antenna located out of the plane of the sparse circular array.

5. The apparatus of claim 1, wherein the antenna under test is a transmitting antenna and the array of test antennas are receiving antennas, or the antenna under test is a receiving antenna and the array of test antennas are transmitting antennas.

6. The apparatus of claim 1, wherein the received signal has sparse data content.

7. The apparatus of claim 1 wherein the processing using compressive sensing is optimized by reducing coherence of a sensing matrix.

8. A method for measuring antenna radiation patterns comprising:
a) positioning an antenna under test proximate to an array of test antennas;
b) controlling signals emitted and received by the antenna under test and the array of test antennas, where the received signals comprise either amplitude only signals or amplitude and phase signals;
c) processing the received signals using compressive sensing; and
d) producing an antenna radiation pattern for the antenna under test from the processed received signals
wherein the array of test antennas is a spherical array.

9. The method of claim 8, wherein the array of test antennas is a sparse spherical array and the method further comprises rotating the antenna under test after d) and repeating b), c) and d).

10. The method of claim 8, wherein, for received signals having amplitude and phase signals, the array of test antennas is a circular array and, for received signals having amplitude only signals, the array of test antennas is a circular array having an additional offset antenna located out of the plane of the circular array, and the method further comprises rotating the antenna under test after d) and repeating b), c) and d).

11. The method of claim 8, wherein, for received signals having amplitude and phase signals, the array of test antennas is a sparse circular array and, for received signals having amplitude only signals, the array of test antennas is a sparse circular array having an additional offset antenna located out of the plane of the circular array, and the method further comprises rotating the antenna under test after d) and repeating b), c) and d).

12. The method of claim 8, wherein the antenna under test is a transmitting antenna and the array of test antennas are receiving antennas, or the antenna under test is a receiving antenna and the array of test antennas are transmitting antennas.

13. The method of claim 8, wherein the received signal has sparse data content.

14. The method of claim 8, wherein processing using compressive sensing further comprises optimizing the processing by reducing coherence of a sensing matrix.

15. Apparatus for measuring antenna radiation patterns comprising:
an array of test antennas, where the array of test antennas comprises a spherical array, a sparse spherical array, a circular array having an additional offset antenna located out of the plane of the circular array or a sparse circular array having an additional offset antenna located out of the plane of the sparse circular array;
an antenna under test located proximate to the array of test antennas;
a compressive sensing processor coupled to the antenna under test and the array of test antennas to control signals emitted and received by the antenna under test and the array of test antennas, where the received signals comprise amplitude only signals, processing the received signals using compressive sensing and producing an antenna radiation pattern for the antenna under test.

16. The apparatus of claim 15 where the antenna under test is a transmitting antenna and the array of test antennas are receiving antennas, or the antenna under test is a receiving antenna and the array of test antennas are transmitting antennas.

17. The apparatus of claim 15 where the received signal has sparse data content.

18. The apparatus of claim 15 wherein the processing using compressive sensing is optimized by reducing coherence of a sensing matrix.

* * * * *